(12) United States Patent
Chittipeddi et al.

(10) Patent No.: US 6,207,547 B1
(45) Date of Patent: Mar. 27, 2001

(54) BOND PAD DESIGN FOR INTEGRATED CIRCUITS

(75) Inventors: Sailesh Chittipeddi, Allentown, PA (US); Vivian Ryan, Washington, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/305,766

(22) Filed: May 5, 1999

Related U.S. Application Data

(62) Division of application No. 09/072,369, filed on May 4, 1998, now Pat. No. 5,986,343.

(51) Int. Cl.[7] .............................. H01L 21/44; H01L 23/48
(52) U.S. Cl. .......................... 438/612; 257/758; 257/773
(58) Field of Search .......................... 438/612; 257/758, 257/773

(56) References Cited

U.S. PATENT DOCUMENTS

| | | | |
|---|---|---|---|
| 5,149,674 | * | 9/1992 | Freeman, Jr. et al. . |
| 5,284,797 | * | 2/1994 | Heim . |
| 5,700,735 | * | 12/1997 | Shiue et al. . |
| 5,739,587 | * | 4/1998 | Sato . |
| 5,751,065 | * | 5/1998 | Chittipeddi et al. . |

* cited by examiner

Primary Examiner—Charles Bowers
Assistant Examiner—Stephen W. Smoot

(57) ABSTRACT

The present invention provides a bond pad support structure for use in an integrated circuit having a bond pad located thereon. In one embodiment, the bond pad support structure comprises a support layer that is located below the bond pad and that has an opening formed therein. The bond pad support structure further includes a dielectric layer that is located on the conductive layer and that extends at least partially into the opening to form a bond pad support surface over at least a portion of the opening. The first bond pad support layer, in one embodiment, may comprise a conductive metal and the second bond pad support layer may comprise of a dielectric material. The present invention provides a unique bond pad structure wherein an opening within a first bond pad support layer is at least partially filled with a second bond pad support layer. It is believed that the inter-structural cooperation between these two layers provides a graded composite support structure that acts as a differential force transducer to buffer internal and bonding stresses within an integrated circuit.

8 Claims, 4 Drawing Sheets

BOND PAD DESIGN FOR INTEGRATED CIRCUITS

This Application is a Divisional of prior Application Ser. No. 09/072,369, filed on May 4, 1998, is now U.S. Pat. No. 5,986,343, to Sailesh Chittipeddi, et al.. The above-listed Application is commonly assigned with the present invention and is incorporated herein by reference as if reproduced herein in its entirety under Rule 1.53(b).

TECHNICAL FIELD OF THE INVENTION

The present invention is directed, in general, to integrated circuits and, more specifically, to integrated circuits having bond pads incorporated therein.

BACKGROUND OF THE INVENTION

Much attention is given to certain aspects of integrated circuit (IC) technology, such as the number or dimensions of the devices in the circuit and circuit processing speeds that can reach millions of instructions per second (MIPS). Clearly, progress in these areas has great appeal and is readily understood. However, there are other aspects of very large scale integrated (VLSI) circuit technology that are of significant importance. For example, integrated circuits must be electrically contacted to be of any use within a larger electrical circuit. The electrical circuit from the external pins of the integrated circuit package must be connected to the integrated circuit through bond pads that are generally located on the periphery of the integrated circuit. The bond pads, which are typically exposed at the microchip die level, provide the interconnectivity between the integrated circuits on the die and the electrical circuit in which the microchip will be installed. They are generally located on the periphery of the integrated circuit die. Bond pads are metal areas that are electrically connected to the devices within the integrated circuit through buffers and electrically conducting interconnects. While the bond pads are formed during the layering process, wires must ultimately be attached to the bond pads to connect to the external pins of the completed integrated circuit package. As a result of conventional bonding technology, as well as the physical size of the wires and the nature of the bond, the bond pads have relatively large dimensions as compared to device dimensions. Because of their size, the bond pads occupy a significant percentage of the chip surface. The area underneath the bond pads thus occupies a substantial fraction of the entire chip surface.

The electrical connection between the package and the bond pad requires physical integrity as well as high electrical conductivity. The conventional bonding process used to form the connection typically requires elevated temperatures and/or relatively high pressures to produce a good connection between the wire and the bond pad. With the bond pad typically located on top of a dielectric layer, the bonding conditions produce thermal and mechanical stresses in the dielectric. These stresses may cause defects in the dielectric that, in turn, result in large leakage currents through the dielectric between the bond pads and the underlying, electrically-conducting substrate. These leakage currents have traditionally precluded use of the substrate area under the bond pads for active devices, thereby decreasing the device packing fraction. The buffers are typically located on the periphery of the integrated circuit and between bond pads to avoid placement under the bond pads. Similarly, the spacing between bond pads must be increased to accommodate the buffers or other devices.

In the prior art, active circuitry has been successfully constructed in the lower layers of an integrated circuit under the bond pad footprint by depositing a simple metal cushion pad in the metal layer below the bond pad. This metal pad acts as a cushion, protecting the dielectric layers below it from the pressure and heat of the wire bonding process. However, as the technology advances toward even smaller device sizes, which may be on the order of 0.3 or even 0.25 micron, this metal pad loses its effectiveness. Examination of integrated circuits at the 0.3 micron device size, shows cracks in the dielectric in at least 50 percent of the samples. Therefore, it must be concluded that this technology has reached its practical limit at a 0.3 micron device size.

Accordingly, what is needed in the art is an improved method for providing a bond pad support structure that substantially reduces the risk of damage to the circuit structure during the bonding process and allows more efficient use of chip area.

SUMMARY OF THE INVENTION

To address the above-discussed deficiencies of the prior art, the present invention provides a bond pad support structure for use in an integrated circuit having a bond pad located thereon. In one embodiment, the bond pad support structure comprises a support layer that is located below the bond pad and that has an opening formed therein. The bond pad support structure further includes a dielectric layer that is located on the conductive layer and that extends at least partially into the opening to form a bond pad support surface over at least a portion of the opening. The first bond pad support layer, in one embodiment, may comprise a conductive metal and the second bond pad support layer may comprise a dielectric material.

Thus, the present invention provides a unique bond pad a structure wherein an opening within a first bond pad support layer is at least partially filled with a second bond pad support layer. It is believed that the inter-structural cooperation between these two layers provides a graded composite support structure that acts as a differential force transducer to buffer internal and bonding stresses within an integrated circuit.

In another embodiment, the bond pad support structure further comprises a plurality of openings wherein each of the openings is formed in a geometric pattern in the first bond pad support layer. The first bond pad support layer, in an advantageous embodiment, is located immediately under the bond pad. However, it will be appreciated that the bond pad support layer may be located at other levels below the bond pad as well. In one aspect of this particular embodiment, the openings form a plurality of nested geometric patterns in the first bond pad support layer. These nested geometric patterns may take on a variety of geometric shapes. For example, they may be rectangular, hexagonal, octagonal or may even be free-form. In yet another aspect, the nested geometric patterns are concentric geometric patterns.

The dimensions of opening or the nested geometric patterns may also vary. In one embodiment, an outer one of the nested geometric patterns may be wider than an inner one of the nested geometric patterns. Additionally, the nested geometric patterns may be spaced apart by a distance that decreases from an inner one of the nested geometric patterns to an outer one of the nested geometric patterns. It is believed that these dimensions and spacing may be varied to accommodate differing stress requirements within a given integrated circuit design.

In yet another embodiment the nested geometric patterns are positioned under at least a portion of a footprint of the bond pad. Alternatively, the footprint of the bond pad is positioned over the nested geometric patterns or, the opening may be positioned under at least a portion of a footprint of the bond pad.

In another aspect, the present invention provides a method of fabricating a bond pad support structure in an integrated circuit having a bond pad located thereon. In one illustrative embodiment, the method comprises the steps of forming a first bond pad support layer below the bond pad, forming an opening in the first bond pad support layer, and forming a second bond pad support layer on the first bond pad support layer and at least partially into the opening to form a bond pad support surface over at least a portion of the opening.

In yet another aspect, the present invention provides an integrated circuit system. In one embodiment, the integrated circuit system comprises a bond pad having a footprint and located on the integrated circuit system and a bond pad support structure. In this particular embodiment, the bond pad structure includes a conductive metal layer that is located below the bond pad and that has a plurality of nested geometric patterned openings formed therein. The bond pad structure further includes a dielectric layer that is located on the conductive layer and that extends at least partially into the nested geometric patterned openings to form a bond pad support surface over at least a portion of the nested geometric patterned openings. In this aspect, the nested geometric patterned openings are positioned under at least a portion of the footprint.

The foregoing has outlined, rather broadly, preferred and alternative features of the present invention so that those who are skilled in the art may better understand the detailed description of the invention that follows. Additional features of the invention that form the subjects of the present invention's claims are described below. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
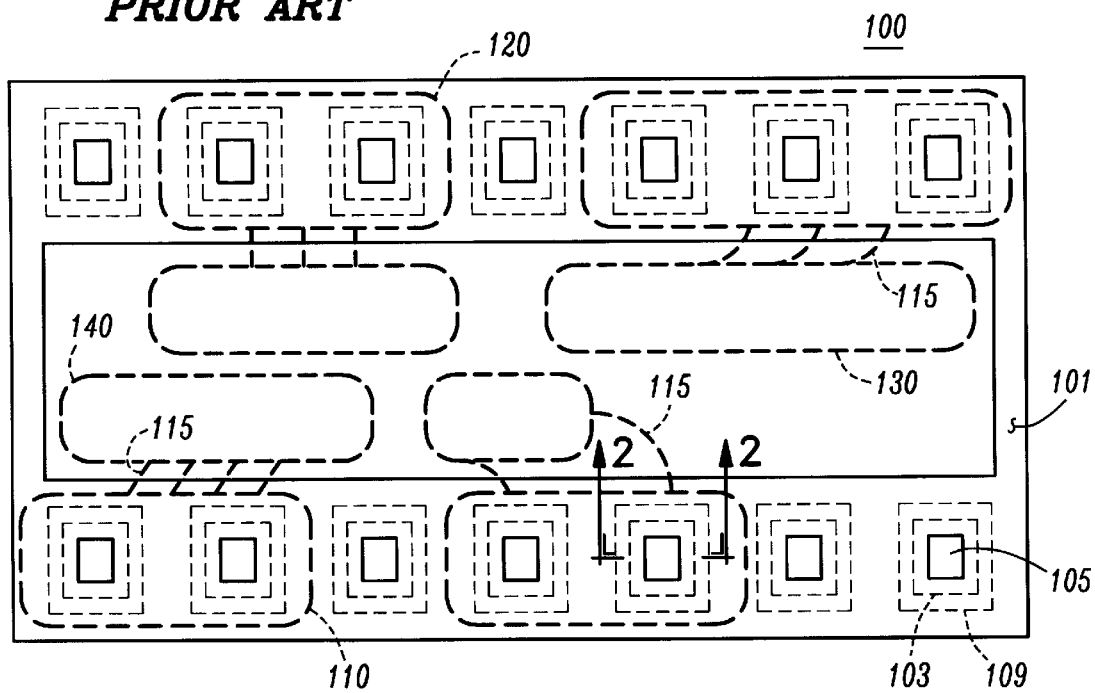
FIG. 1 illustrates a top view of an exemplary, conventional, integrated circuit die.

Referring initially to FIG. 1, illustrated is a top view of an exemplary, conventional, integrated circuit die. An integrated circuit (die), generally designated 100, comprises a dielectric layer 101 that overlies the entire die 100. The dielectric layer 101 has been patterned to expose portions 105 of a plurality of metal bond pads 103. Areas of the die 100 formed on a semiconductor substrate (not shown) comprise a plurality of representative microcircuits 110, 120, 130, 140 with varying functions.

As one who is skilled in the art will recognize, combinations of gates, source and drain regions, etc., constitute semiconductor circuits that may be designed to perform a variety of functions. An integrated circuit comprises an assemblage of certain combinations of these semiconductor devices that constitute a plurality of electronic modules. For example, these modules may include a clock, a central processing unit, a memory array, a numeric co-processor, or other modules with specific functions. clearly, the modules chosen are dictated by the nature of the intended use of the integrated circuit. The placement of the various modules on the die is dictated by design considerations that do not affect the scope and intent of the present invention. However, for the purposes of the present discussion, at least a portion of the active microcircuits 110, 120, 130, 140 are located in the area under the bond pads 103. These modules may be referred to as the primary microcircuitry of the die 100. Individual circuits 130, 140 are electrically connected to the bond pads 103 on a particular microchip die by circuit traces 115 formed within the conducting layers of the die 100.

One who is skilled in the art will recognize that circuitry deposited at any layer on the surface of a semiconductor wafer creates a distinct footprint. Thus, each bond pad 103 creates a bond pad footprint. In prior art with device sizes greater than 0.3 micron, individual circuits 110, 120, 130, 140 have been successfully constructed in the lower layers of the die 100 under the bond pads 103 by depositing a metal cushion pad 109 in the metal layer below the bond pads 103. The footprint of the bond pad 103 is at least partially aligned with the metal cushion pad 109 in the metal layer below.

Figure 2:
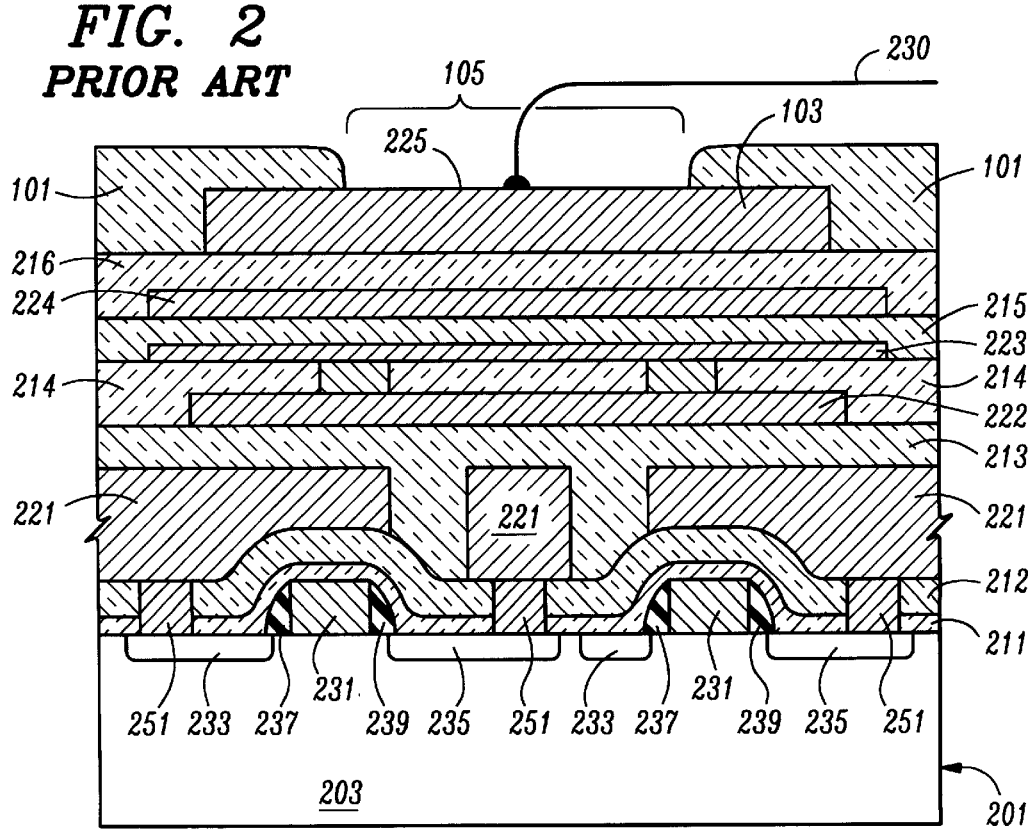
FIG. 2 illustrates a sectional view along plane 2—2 of a portion of the integrated circuit of FIG. 1.

Referring now to FIG. 2, illustrated is a sectional view along plane 2—2 of a portion of the integrated circuit of FIG. 1. A portion of the periphery of the die 100 including the bond pad 103, metal and dielectric layers and active devices under the bond pad 103 are illustrated. Depicted are: a substrate 201, representative active semiconductor devices 203, a first dielectric layer 211, a second dielectric layer 212, a first metal layer 221, a third dielectric layer 213, a second metal layer 222, a fourth dielectric layer 214, a third metal layer 223, a fifth dielectric layer 215, a fourth metal layer 224, a sixth dielectric layer 216, a fifth metal layer 225, and a seventh dielectric layer 101. The accessible portion of the fifth metal layer 225 constitutes the exposed portion 105 of the bond pad 103 of FIG. 1. A wire 230 has been bonded to the bond pad 103.

For the purposes of further discussion, the active semiconductor devices 203 under the bond pads 103 are representative of any active circuitry of the primary microcircuit 110. Windows 251 in dielectric layers 211, 212 provide electrical connections between the substrate 201 and metal layer 221. The metal layer 224 nearest the bond pad 103 provides stress relief during the bonding process that prevents dielectric layers 211, 212, 213, and 214 below the bond pad 103 from cracking. The fourth metal layer 224 comprises a metal sheet formed beneath the bond pad 103 on the fifth metal layer 225. The area underneath the bond pads 103 may thus be used for active circuitry with reduced risk of damage to the dielectric layers below the bond pads 103. With active circuitry located beneath the bond pads 103, the bond pads 103 may also be spaced more closely together;

this allows more bond pads 103 per linear peripheral distance. Further, a more efficient use of silicon is achieved with this physical layout, and therefore a larger yield of die per wafer is realized.

The active semiconductor devices 203 depicted in FIG. 2 represent active devices, specifically a field effect transistor. The field effect transistor has a gate structure 231, source/drain regions 233 and 235 on opposite sides of gate structure 231, and insulating sidewalls 237 and 239 on opposite sides of the gate structure 231. Gate structure 231 is formed from polysilicon. Insulating portions of the gate structure 231, such as the gate oxide, are well known to those who are skilled in the art. First and second dielectric layers 211 and 212 are conformal dielectrics such as tetraethylorthosilicate (TEOS) and borophospho-tetraethylorthosilicate (BPTEOS), respectively. Other dielectric layers can also be formed from well known deposited oxides or nitrides. The metal layers may be aluminum or other conductive metals suitable for use in semiconductor devices. Additives, such as silicon, may be present in minor amounts. As shown, at least a portion of the active semiconductor devices 203, are formed directly under the footprint of the bond pads 103. The details of forming microcircuitry are familiar to one who is skilled in the art. Of importance to the current invention is the prevention of damage to the dielectric layers beneath the bond pads.

The structure depicted will be readily fabricated by those who are skilled in the art using well known techniques to deposit and pattern the dielectric and metal layers and to form the devices. For example, well known lithographic, ion implantation, etching, etc., processes may be used. Therefore, detailed description of suitable processes is not required. Of course, the details of an integrated circuit will depend upon the applications desired for the integrated circuit. The packaging connection to the bonding pad is done by any of the conventional and well known techniques presently used. In the illustrated embodiment, the fourth metal layer 224 protects the active semiconductor devices 203 during application and bonding of the wire 230. The footprint of the bond pad 103 is substantially aligned with the footprint of the fourth metal layer 224 as well as with the footprint of the active semiconductor devices 203.

Variations in the embodiment depicted will be readily apparent to those who are skilled in the art. Although an embodiment with five metal layers has been described, fewer or more numerous metal layers may be present. Additionally, the bond pads need not be on the periphery of the integrated circuit.

Figure 3:
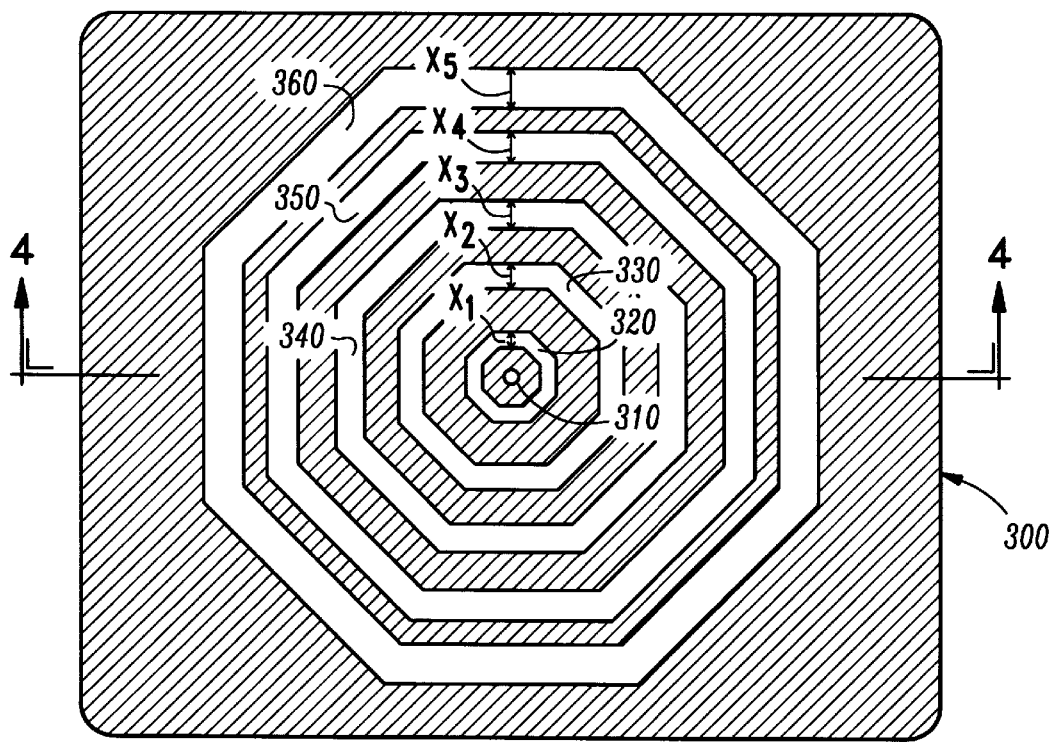
FIG. 3 illustrates a plan view of one embodiment of a first bond pad support layer constructed according to the principles of the present invention.

Referring now to FIG. 3 with continuing reference to FIG. 2, illustrated is a plan view of one exemplary embodiment of a first bond pad support layer constructed according to the principles of the present invention. A first bond pad support layer, generally designated 300, comprises a plurality of openings 310, 320, 330, 340, 350, 360. In an advantageous embodiment, the first bond pad support layer 300 is formed in the fourth metal layer 224 below the bond pad layer (fifth metal layer) 225. The fourth metal layer 224 may also be referred to as a first bond pad support layer 300. In this embodiment, each of the plurality of openings 310, 320, 330, 340, 350, 360 form a nested, geometric pattern in the first bond pad support layer 300. Conventional photolithographic process, which are known to those who are skilled in the art, may be used to form the plurality of openings 310, 320, 330, 340, 350, 360 in the metal layer 224. In a particularly advantageous embodiment, these nested geometric patterns are concentric geometric patterns. While illustrated as octagonal, the geometric shapes may take on a variety of shapes. For example, they may be rectangular, hexagonal, octagonal or may even be free-form. In a preferred embodiment, any selected outer opening 320, 330, 340, 350, or 360 is wider than an opening 310, 320, 330, 340, 350 relatively closer to the center of the geometric pattern, i.e., opening 360 is wider than the opening 350 is wider than the opening 340 ($X_5 > X_4 > X_3 > X_2 > X_1$).

Figure 4:
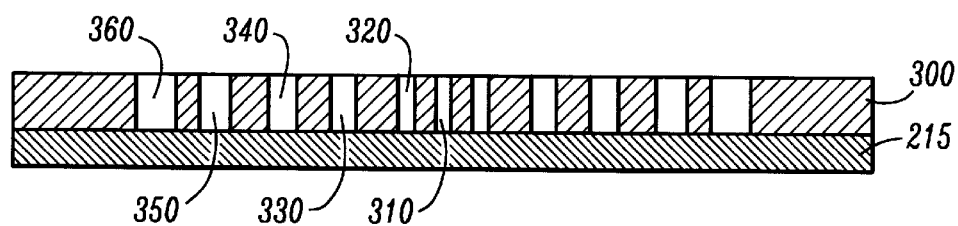
FIG. 4 illustrates a sectional view along plane 4—4 of the first bond pad support layer of FIG. 3.

Referring now to FIG. 4, illustrated is a sectional view along plane 4—4 of the first bond pad support layer 300 of FIG. 3. In another advantageous embodiment, the openings 310, 320, 330, 340, 350, and 360, are conventionally patterned to penetrate the first bond pad support layer 300 to the surface of the fifth dielectric layer 215 of FIG. 2. While the illustrated embodiment defines six concentric openings 310, 320, 330, 340, 350, 360 of representative sizes in the metal layer 224, one who is skilled in the art will recognize that the number of openings, and the size thereof, may be varied while remaining within the scope and intent of the present invention.

Figure 5:
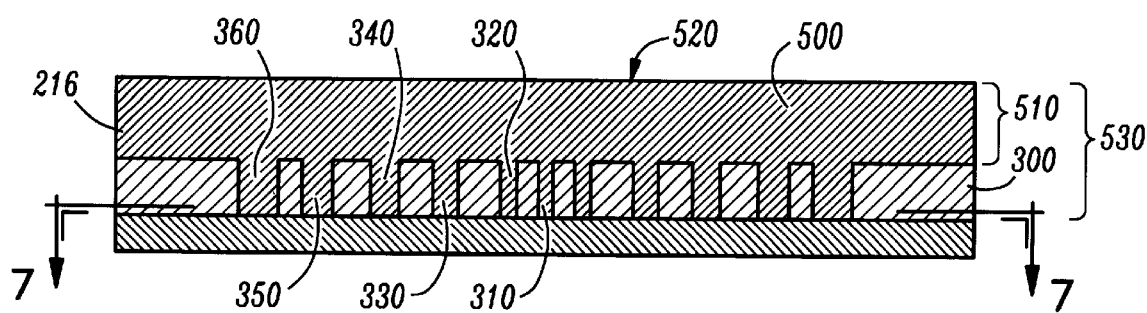
FIG. 5 illustrates a sectional view along plane 4—4 of the first bond pad support layer of FIG. 3 with a second bond pad support layer formed thereon.

Referring now to FIG. 5 with continuing reference to FIGS. 2 and 3, illustrated is a sectional view along plane 4—4 of the first bond pad support layer of FIG. 3 with a second bond pad support layer 500 formed thereon. The second bond pad support layer 500, which in a preferred embodiment comprises a dielectric layer, is deposited on the first bond pad support layer 300 so as to at least partially fill the plurality of openings 310, 320, 330, 340, 350, 360 and to form a contiguous dielectric layer 510. The contiguous dielectric layer 510 may be likened to the sixth dielectric layer 216 of FIG. 2. In an advantageous embodiment, the contiguous dielectric layer 510 is located on the first bond pad support layer 300 and extends at least partially into the openings 310, 320, 330, 340, 350, 360. While FIG. 5 illustrates that the second bond pad support layer.500 forms a bond pad support surface 520 over the entire portion of openings 310, 320, 330, 340, 350, 360, it should be understood that the bond pad support surface may be formed over only a portion of the above-mentioned openings 310, 320, 330, 340, 350, 360. The first bond pad support layer 300 and the second bond pad support layer 500 cooperate to form a bond pad support structure 530 underlying the bond pad 103.

Figure 6:
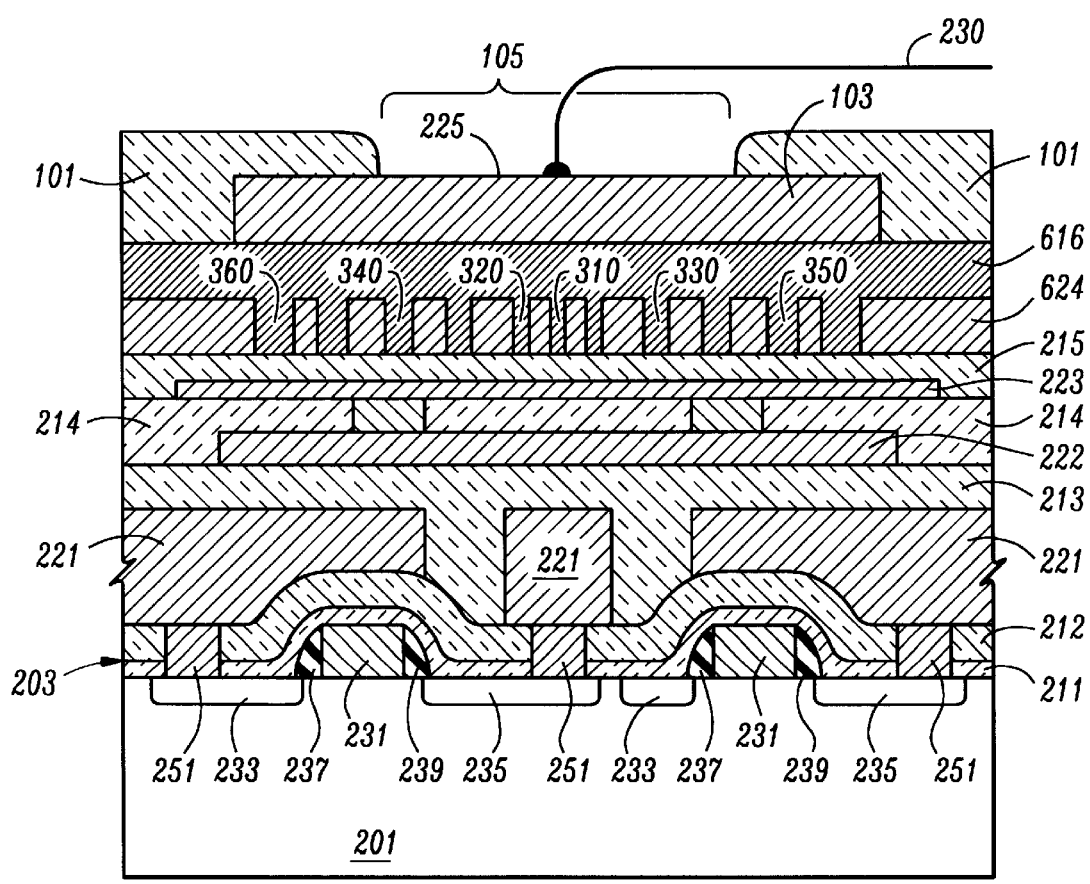
FIG. 6 illustrates a sectional view along plane 4—4 of a portion of an exemplary integrated circuit employing the bond pad support structure of FIG. 5.

Referring now to FIG. 6 with continuing reference to FIG. 2, illustrated is a sectional view along plane 4—4 of a portion of an exemplary integrated circuit employing the bond pad support structure of FIG. 5. The underlying structure of the representative integrated circuit is analogous to the integrated circuit of FIG. 2 from the substrate 201 through dielectric layer 215. However, the integrated circuit of FIG. 6 differs from that of FIG. 2 in that openings 310, 320, 330, 340, 350, and 360 of FIG. 6 are patterned in the fourth metal layer 624. The sixth dielectric layer 616 has been deposited on the fourth metal layer 624 and at least partly fills the openings 310, 320, 330, 340, 350 and 360. Note that the thickness of an opening 310, 320, 330, 340, 350, 360 is progressively larger as it is further from the center of the support structure. Additionally, the nested geometric patterns are spaced apart by a distance that decreases from an inner one, e.g. 310, of the nested geometric patterns toward an outer one, e.g. 360, of the nested geometric patterns.

Figure 7:
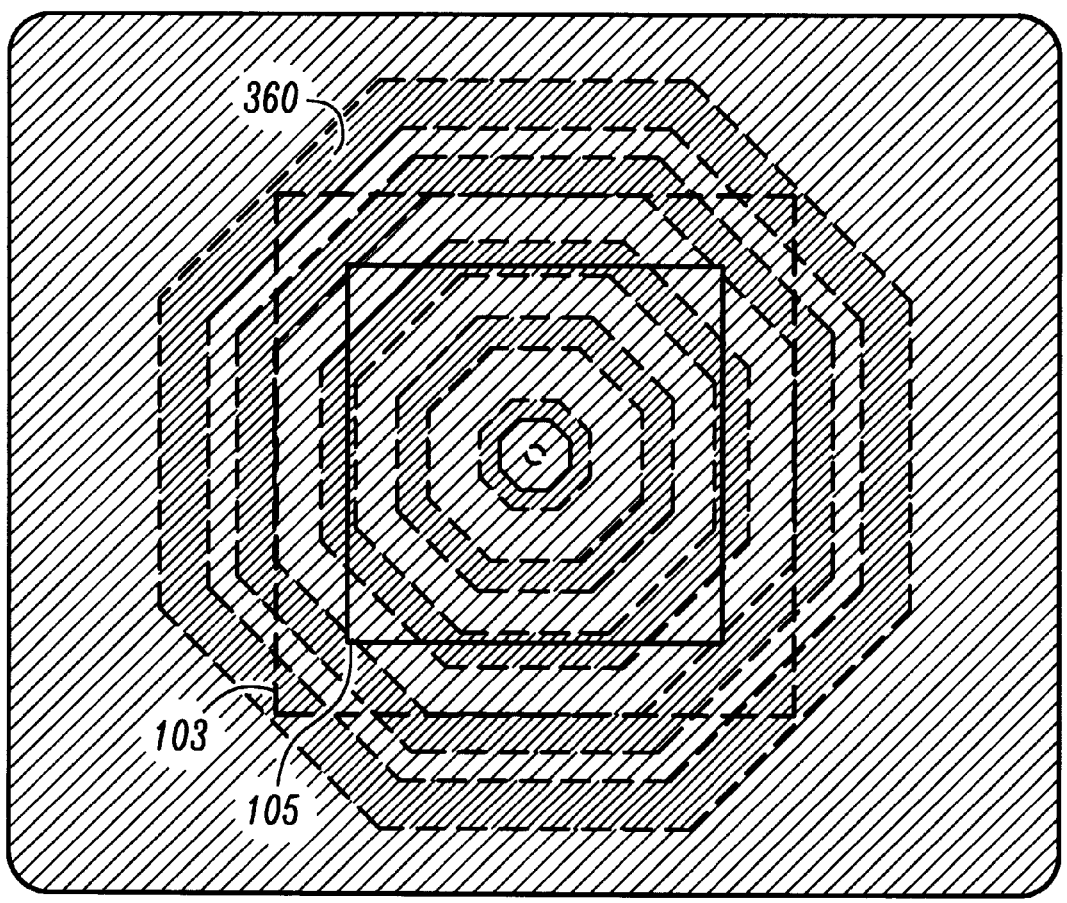
FIG. 7 illustrates a sectional view along plane 7—7 of the bond pad support layer of FIG. 5 with a bond pad footprint superimposed for reference.

Referring now to FIG. 7 with continuing reference to FIG. 5, illustrated is a sectional view along plane 7—7 of the bond pad support layer of FIG. 5 with a bond pad footprint superimposed for reference. As can be seen, the bond pad footprint 103 extends at least partially over the outermost opening 360 that has been filled with dielectric. The exposed portion 105 of the bond pad 103 is likewise shown for reference. Thus, in a particularly advantageous embodiment, the bond pad support structure 530 comprises a plurality of concentric geometric patterns alternately composed of the metal of the fourth metal layer 224 of FIG. 2 and of the dielectric of the sixth dielectric layer 216 of FIG. 2. Testing has shown that a structure manufactured in accordance with the principals of the present invention this structure tolerates up to a 500 percent increase in bonding force without catastrophic damage to the underlying circuitry. Therefore, it is believed that the inter-structural cooperation between these two layers provides a graded composite support structure that acts as a differential force transducer to buffer bonding stresses within an integrated circuit.

From the foregoing it can be seen that the present invention provides a bond pad support structure for use in an integrated circuit having a bond pad located thereon. In one embodiment, the bond pad support structure comprises a support layer that is located below the bond pad and that has an opening formed therein.

The bond pad support structure further includes a dielectric layer that is located on the conductive layer and that extends at least partially into the opening to form a bond pad support surface over at least a portion of the opening. The first bond pad support layer, in one embodiment, may comprise a conductive metal and the second bond pad support layer may comprise of a dielectric material.

Although the present invention has been described in detail, those who are skilled in the art should understand that they can make various changes, substitutions and alterations herein without departing from the spirit and scope of the invention in its broadest form.

What is claimed is:

1. A method of fabricating a bond pad support structure in an integrated circuit having a bond pad located thereon, comprising the steps of:

forming a first bond pad support layer located below said bond pad;

forming an opening in said first bond pad support layer; and forming a second bond pad support layer on said first bond pad support layer and at least partially into said opening to form a bond pad support surface over at least a portion of said opening, wherein said step of forming a second bond pad support layer includes forming a dielectric layer.

2. The method as recited in claim 1 wherein said step of forming an opening in said first bond pad support layer includes forming a plurality of openings in a geometric pattern in said first bond pad support layer.

3. The method as recited in claim 2 wherein said step of forming a plurality of openings includes forming a plurality of nested geometric patterns in said first bond pad support layer.

4. The method as recited in claim 3 wherein said step of forming a plurality of nested geometric patterns includes forming concentric geometric patterns of said nested geometric patterns.

5. The method as recited in claim 3 wherein said step of forming said nested geometric patterns includes forming an outer one of said nested geometric patterns with a width wider than a width of an inner one of said nested geometric patterns.

6. The method as recited in claim 3 wherein said step of forming said nested geometric patterns includes forming said nested geometric patterns spaced apart by a distance that decreases from an inner one of said nested geometric patterns to an outer one of said nested geometric patterns.

7. The method as recited in claim 3 wherein said step of forming said nested geometric patterns includes forming said nested geometric patterns under at least a portion of a footprint of said bond pad.

8. The method as recited in claim 1 wherein said step of forming a first bond pad support layer includes forming a conductive metal layer.

* * * * *